United States Patent
Yang

(10) Patent No.: US 6,841,814 B2
(45) Date of Patent: Jan. 11, 2005

(54) PHOTODIODE FOR ULTRA HIGH SPEED OPTICAL COMMUNICATION AND FABRICATION METHOD THEREFOR

(75) Inventor: Seung-Kee Yang, Suwon-shi (KR)

(73) Assignee: Samsung Electronics Co., Ltd, Suwon-Si (KR)

( * ) Notice: Subject to any disclaimer, the term of this patent is extended or adjusted under 35 U.S.C. 154(b) by 39 days.

(21) Appl. No.: 10/315,841

(22) Filed: Dec. 10, 2002

(65) Prior Publication Data

US 2003/0127668 A1 Jul. 10, 2003

(30) Foreign Application Priority Data

Jan. 8, 2002 (KR) .................. 10-2002-0000959

(51) Int. Cl.[7] .................. H01L 31/062; H01L 31/113; H01L 31/072; H01L 31/109; H01L 31/0328
(52) U.S. Cl. .................. 257/290; 257/291; 257/292; 257/200; 257/233; 257/461
(58) Field of Search .................. 257/200, 233, 257/290–292, 461

(56) References Cited

U.S. PATENT DOCUMENTS

| | | | |
|---|---|---|---|
| 6,605,831 B1 * | 8/2003 | Inai et al. ................ | 257/194 |
| 2002/0100911 A1 * | 8/2002 | Arakawa et al. ........... | 257/79 |
| 2002/0110945 A1 * | 8/2002 | Kuramata et al. ......... | 438/36 |
| 2003/0047791 A1 * | 3/2003 | Flynn et al. .............. | 257/450 |

FOREIGN PATENT DOCUMENTS

JP          3-163822          11/1989

* cited by examiner

*Primary Examiner*—Jerome Jackson
*Assistant Examiner*—Jesse A. Fenty
(74) *Attorney, Agent, or Firm*—Cha & Reiter, LLC

(57) ABSTRACT

Disclosed is a photodiode having a p-type electrode of a mushroom shape. The p-type electrode is formed in a mushroom shape, so that the contact area faced by the spreading region of a dopant for the photodiode and the electrode can be minimized and the capacitance of the photodiode can be reduced. Further, the p-type electrode is configured to have a broader width in its upper end, thus allowing the wire bonding to be performed easily.

8 Claims, 8 Drawing Sheets

PHOTODIODE FOR ULTRA HIGH SPEED OPTICAL COMMUNICATION AND FABRICATION METHOD THEREFOR

CLAIM OF PRIORITY

This application claims priority to an application entitled "PHOTODIODE FOR ULTRA HIGH SPEED OPTICAL COMMUNICATION AND FABRICATION METHOD THEREFOR," filed in the Korean Industrial Property Office on Jan. 8, 2002 and assigned Serial No. 02-959, the contents of which are hereby incorporated by reference.

BACKGROUND OF THE INVENTION

1. Field of the Invention

The present invention relates to an optical receiving element, and particularly to a photodiode used in an optical communication system.

2. Description of the Related Art

In the optical communication, an electrical signal is converted into an optical signal at the transmitting end using a light emitting element and then transmitted through a transmission line, such as an optical fiber. The converted optical signal is converted back into an electrical signal at the receiving end using a light receiving element, such as a photodiode. Most widely used photodiodes have a mesa type structure.

FIG. 1 is a cross-sectional view of a conventional photodiode 10 having a mesa type structure. As shown in FIG. 1, the non-doped InGaAs and p-InP are sequentially stacked at one end of an InP substrate 11 by means of a single crystal growing process. An u-InGaAs absorption layer 12 of a mesa type and a p-InP window layer 13 are formed by etching. Thereafter, silicon nitride(SiNx) is stacked on the p-InP window layer 13 so that an insulation layer 14 is formed, and a predetermined portion of the insulation layer 14 is etched so that a part of the p-InP window layer 13 has an opening. A p-type electrode 15 is provided on the open portion of the p-InP window layer 13. Meanwhile, a non-reflection coating is applied to the position corresponding to the p-InP window layer 13 on the other side of the InP substrate 11, so that a light receiving region 17 having a predetermined size and an n-type electrode 16 are formed.

In the method of fabricating a photodiode of a mesa type as described above, the non-doped InGaAs and p-InP layers are stacked through the single crystal growth process. Further, the undesirable spreading of a p-type dopant, such as Zn or Cd, is not necessary.

The conventional photodiode having the mesa type structure, however, has several drawbacks in that the non-doped InGaAs and the p-InP are formed as layers in the form of a mesa type, then exposed to the atmosphere. As such, the non-doped InGaAs and the p-InP materials can be oxidized during a fabrication process. This oxidation may cause a deterioration in the quality of the optical element. In addition, a current leakage may occur on the surface that is mesa-etched, i.e., the surface facing the insulation layer, thereby reducing the life of the optical component. Moreover, the InGaAs film whose energy band gap is small, may have a larger current leakage, thus further deteriorating the reliability of the optical circuit.

Furthermore, in an ultra high-speed optical communication, the capacitance of the optical circuit must be small which can be achieved by reducing the spreading region of the p-InP. The photodiode of a related art, however, makes wire bonding by providing a p-type electrode connected directly to the spreading region of the p-InP. Therefore, it is difficult to reduce the area of the spreading region of the p-InP.

SUMMARY OF THE INVENTION

The present invention overcomes the above-described problems, and provides additional advantages, by providing a photodiode used in an ultra high-speed optical communication and its fabrication method capable of improving reliability and lowering the capacitance thereof, by preventing a current leakage and enabling easier subsequent wire bonding.

According to one aspect of the invention, a photodiode for ultra high speed optical communication includes: a substrate; an absorption layer formed on an upper surface of the substrate; a window layer stacked on the absorption layer; an insulation layer stacked on the window layer and having a predetermined hole formed thereon; a spreading region in which a predetermined dopant is spread on the part of the window layer facing the hole; and, an upper electrode connected to the spreading region through the hole and formed in a mushroom shape above the insulation layer.

According to another aspect of the invention, a photodiode for ultra high speed optical communication includes: an InP substrate; an InGaAs absorption layer stacked on one side of the InP substrate; an InP window layer stacked on the InGaAs absorption layer; an insulation layer stacked on the InP window layer and having a predetermined hole formed thereon; a p-InP spreading region in which a p-type dopant is doped on the part of the InP window layer facing the hole; a metal of electrical conductivity electrically connected to the p-InP spreading region through the hole and formed in a mushroom shape above the insulation layer.

According to a further aspect of the invention, a method for fabricating a photodiode for ultra high speed optical communication includes the steps of: preparing a predetermined semiconductor substrate in which a spreading region is included, wherein an absorption layer, a window layer, and an insulation layer are stacked in sequence on the predetermined substrate, and the spreading region is formed by spreading a predetermined dopant on the window layer through an opening formed on the part of the insulation layer; forming a photoresist layer on the insulation layer; forming a hole on the photoresist layer by means of a photoetching method so that the hole is connected to the opening of the insulation layer; forming a metal plated layer connected to the spreading region through the hole formed on the photoresist layer; and, removing the photoresist layer.

BRIEF DESCRIPTION OF THE DRAWINGS

The invention will be described in detail with reference to the following drawing in which like reference numerals refer to like elements wherein.

DETAILED DESCRIPTION OF THE PREFERRED EMBODIMENT

The following detailed description will present a photodiode for ultra high speed optical communication and fabrication method thereof according to a preferred embodiment of the invention with reference to the accompanying drawings. For the purposes of clarity and simplicity, well-known functions or constructions are not described in detail as they would obscure the invention in unnecessary detail.

Figure 1:
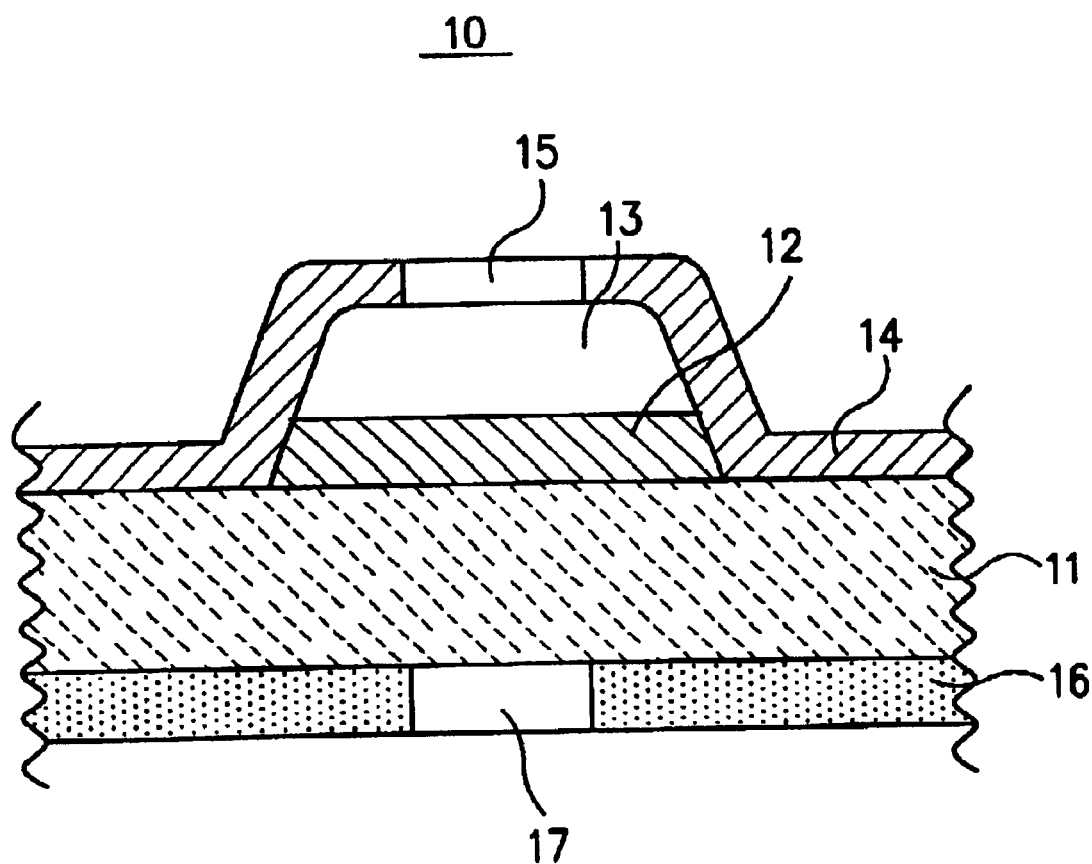
FIG. 1 is a cross-sectional view illustrating a general photodiode of a mesa type.
Figure 2:
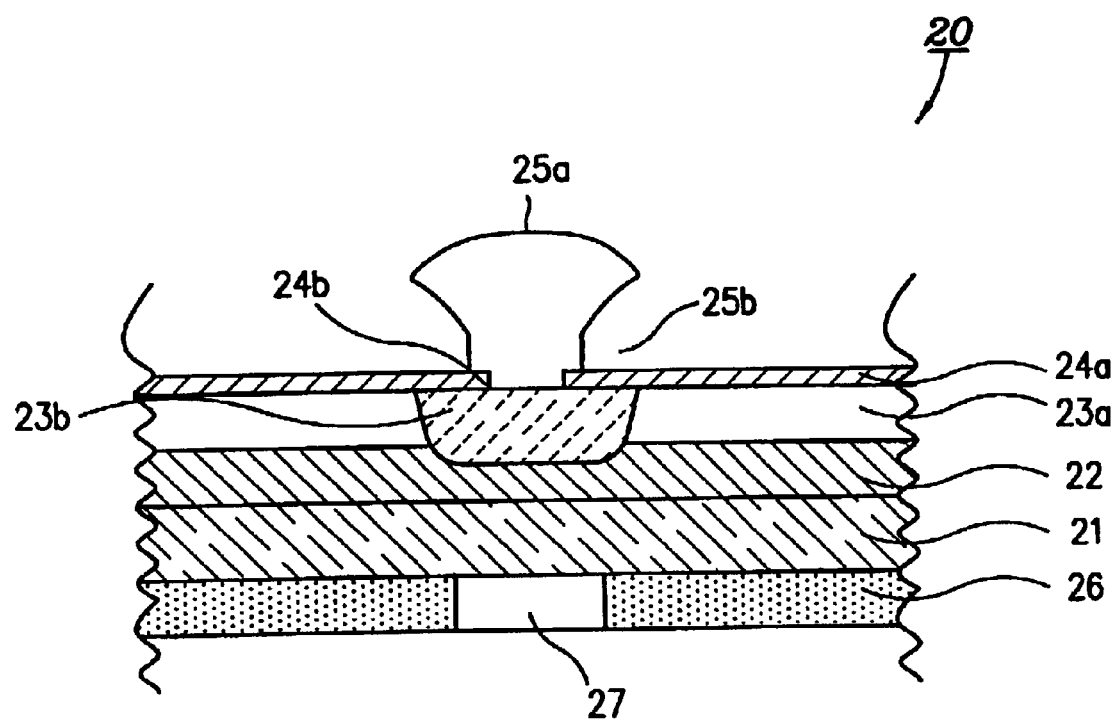
FIG. 2 is a cross-sectional view illustrating a photodiode for ultra high speed optical communication according to a preferred embodiment of the present invention.
Figure 3:
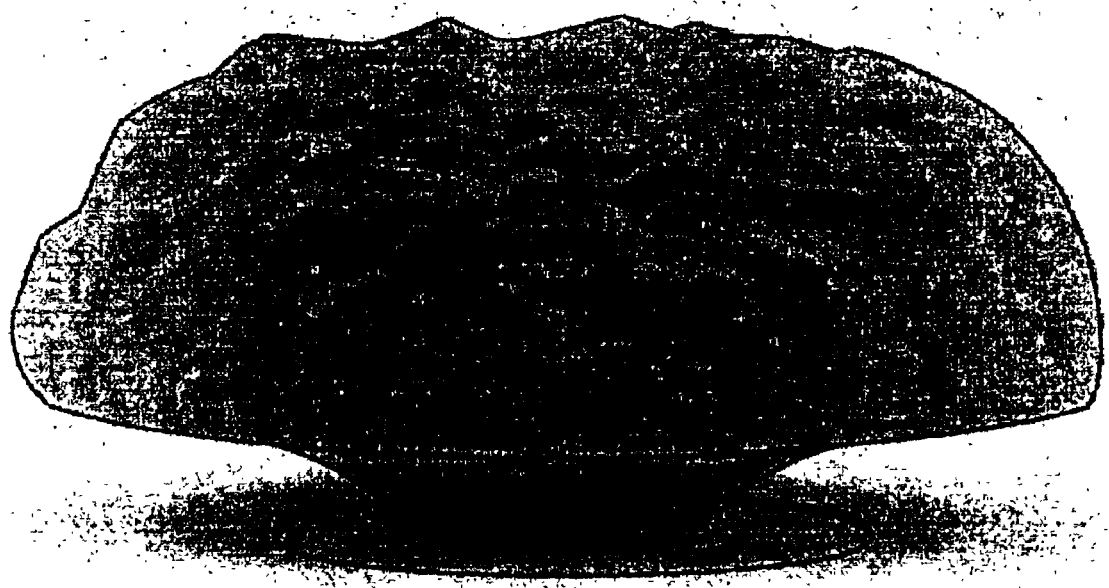
FIG. 3 is a photograph illustrating a metal of electrical conductivity as shown in FIG. 2, formed on a photodiode; and, FIG. 4a through FIG. 4e are illustrative drawings showing the process of forming the metal of electrical conductivity shown in FIG. 3.

FIG. 2 is a cross-sectional view illustrating a photodiode 20 used in an ultra high-speed optical communication system according to a preferred embodiment of the present invention, and FIG. 3 shows a photograph of electrical conductivity of the electrode formed on the photodiode 20 shown in FIG. 2. As shown in FIG. 2, the inventive photodiode 20 includes a u-InGaAs absorption layer 22 on which a non-doped InGaAs is stacked, is formed entirely on at one end of an InP substrate 21; an u-InP window layer 23a on which a non-doped InP is stacked, is formed on the u-InGaAs absorption layer 22; and, an insulation layer 24a on which a SiNx is stacked, is formed on the u-InP window layer 23a.

A predetermined hole 24b is formed on the insulation layer 24a, and a p-InP spreading region 23b on which a p-type dopant such as Zn is doped, is formed on a predetermined region of the u-InP window layer 23a facing the through hole 24b. The p-InP spreading region 23b is extended up to a portion of the u-InGaAs absorption layer 22. The p-InP spreading region 23b is connected to a p-type electrode 25a provided through the hole 24b. The p-type electrode 25a connected to the p-InP spreading region 23b through the hole 24b is exposed above the insulation layer 24a and is formed in a mushroom shape above the insulation layer 24a. Namely, the height of the p-type electrode 25a does not coincide with the surface of the insulation layer 24a, but is extended further above the insulation layer 24a. The area at which the p-type electrode 25a and the surface of the insulation layer 24a face each other is narrower than the surface area of the p-InP spreading region 23b and shaped, so that the farthest away the p-type electrode 25a is distant from the surface of the insulation layer 24a, the broader the p-type electrode 25a becomes. As a result, a predetermined space is formed between the outer periphery of the p-type electrode 25a and the insulation layer 24a, whereby an air layer 25b is obtained. Note that if the p-type electrode 25a is broad enough, the process of wire bonding is easier to implement.

Meanwhile, on the other side of the InP substrate 21, a non-reflection coating using a silicon nitride(referred as SiNx hereinafter) is performed on the position corresponding to the p-InP spreading region 23b, so that a light receiving region 27 is formed. For the rest region, except for the light receiving region 27, the non-reflection coating is removed, then an n-type electrode 26 using an electrical conductivity metal is formed, thereby forming a photodiode 20.

Note that the development of the optical communication was a direct result of higher data transmission speed, and that the transmission speed in the optical communication largely depends on the transmission speed of an optical communication element, such as the photodiode 20. The photodiode 20 used in an ultra high-speed optical communication can improve the transmission speed by increasing the transmission bandwidth. To this end, the smaller the resistance and the capacitance of an optical element are, an increase in the transmission bandwidth can be achieved. As most optical elements today need to be as compact as possible, the capacitance rather than the resistance plays a major role on the transmission bandwidth in the optical communication systems, as noted below mathematically.

The capacitance of the element for optical communication is given by the following formula 1:

[Formula 1]

$$C = \frac{\varepsilon A}{t}$$

Here, A represents an active area activated as the photodiode receives an optical signal, and $\varepsilon$ and t represent a dielectric constant of material occupying the space between electrodes and the distance between electrodes, respectively.

According to the formula 1, if the active area A becomes narrow and the dielectric constant $\varepsilon$ becomes smaller and the distance t between the electrodes becomes larger, then the capacitance C gets smaller. Therefore, in order to make the capacitance of the photodiode 20 smaller, the p-InP spreading region 23b, an active area, must be minimized and the dielectric constant $\varepsilon$ must be reduced. To meet these conditions, the photodiode 20 according to the present invention reduces the p-InP spreading region 23b by minimizing the contact area of the p-type electrode 25a and the p-InP spreading region 23b. This result is achieved by having the p-type electrode 25a formed in a shape such that the farther away the p-type electrode 25a away from the surface facing the p-InP spreading region 23b, the broader the p-type electrode 25a becomes in its width. As a result, the space between the surface of the insulation layer 24a and the p-type electrode 25a is filled with air of low dielectric constant, whereby an air layer 25b is formed. Further, the air layer 25b giving the shape of the p-type electrode 25a lowers the dielectric constant $\varepsilon$ substantially.

As apparent from the foregoing, the present invention minimizes the contact area of the p-type electrode 25a and the p-InP spreading region 23b, thereby reducing the area for the active region of the optical element used in the optical communication. Therefore, the photodiode of the present invention is easy to apply to the ultra high speed optical communication system and has sufficient space for the wire bonding through the formation of the p-type electrode 25a in a mushroom shape.

Now, the process for forming the p-type electrode having a mushroom shape will be described hereinafter.

Figure 4A:
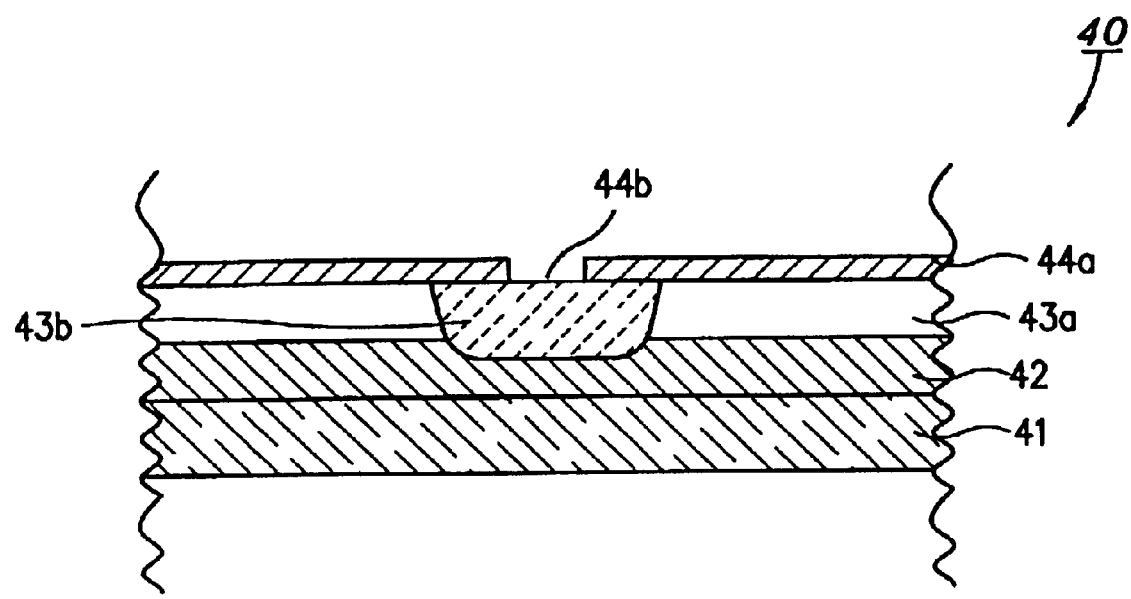
Figure 4B:
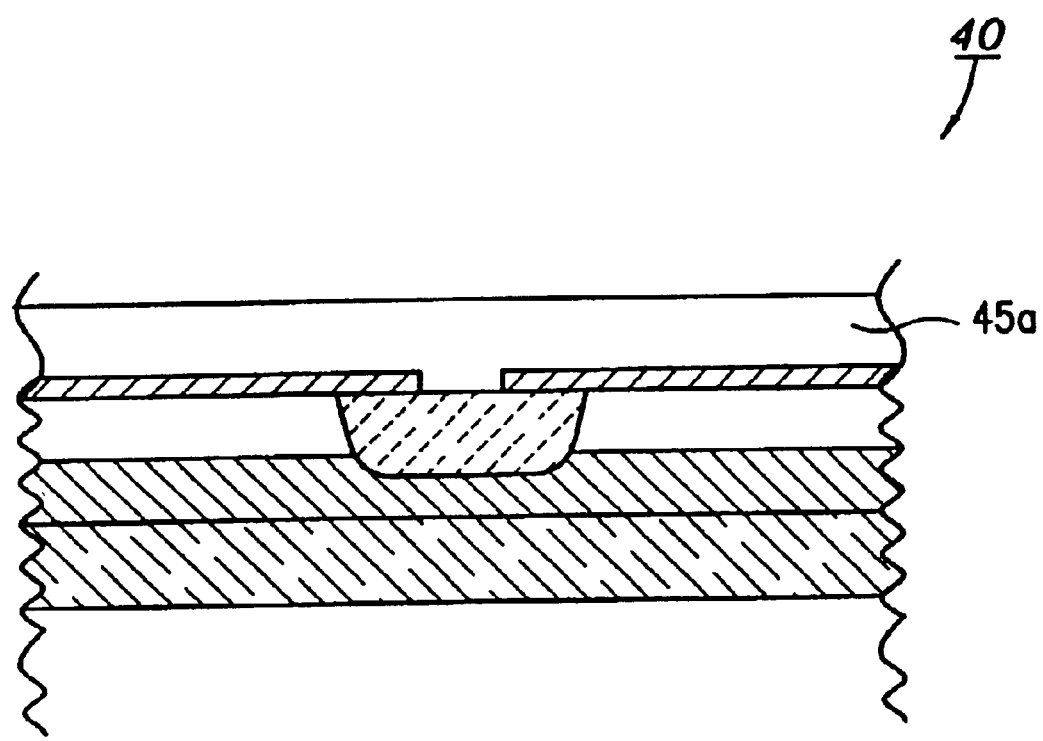

FIG. 4a and FIG. 4b depict the procedures of forming a photoresist layer on a semiconductor substrate 40. As shown in FIG. 4a, the semiconductor substrate 40 includes a predetermined substrate 41, an absorption layer 42, a window layer 43a in which a spreading region 43b is included therein, and an insulation layer 44a on which a hole 44b is formed. Further, a photoresist is applied on the semiconductor substrate 40 so that a photoresist layer 45a is formed as shown in FIG. 4b.

Figure 4C:
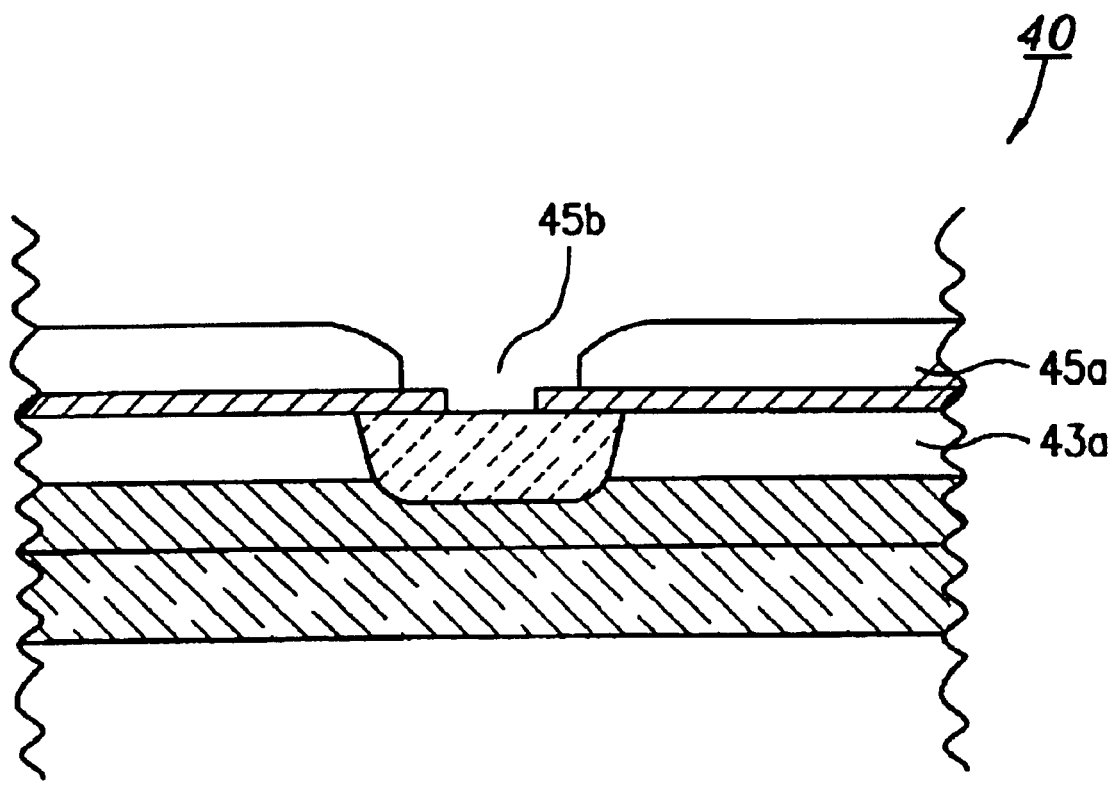

Thereafter, the hole 45b is formed on the photoresist layer 45a with use of the photolithography method as shown in FIG. 4c. The hole 45b is formed in a cylindrical shape by photoetching the hole 44b on the insulation layer 44a, then the process for forming the sidewalls is performed, so that the hole 45b has a broader shape in its upper portion. The hole 45b is connected to the hole 44b of the insulation layer 44a and shaped so that the width of the hole 45b is broader as it moves farther away from the region facing the insulation layer 44a.

Figure 4D:
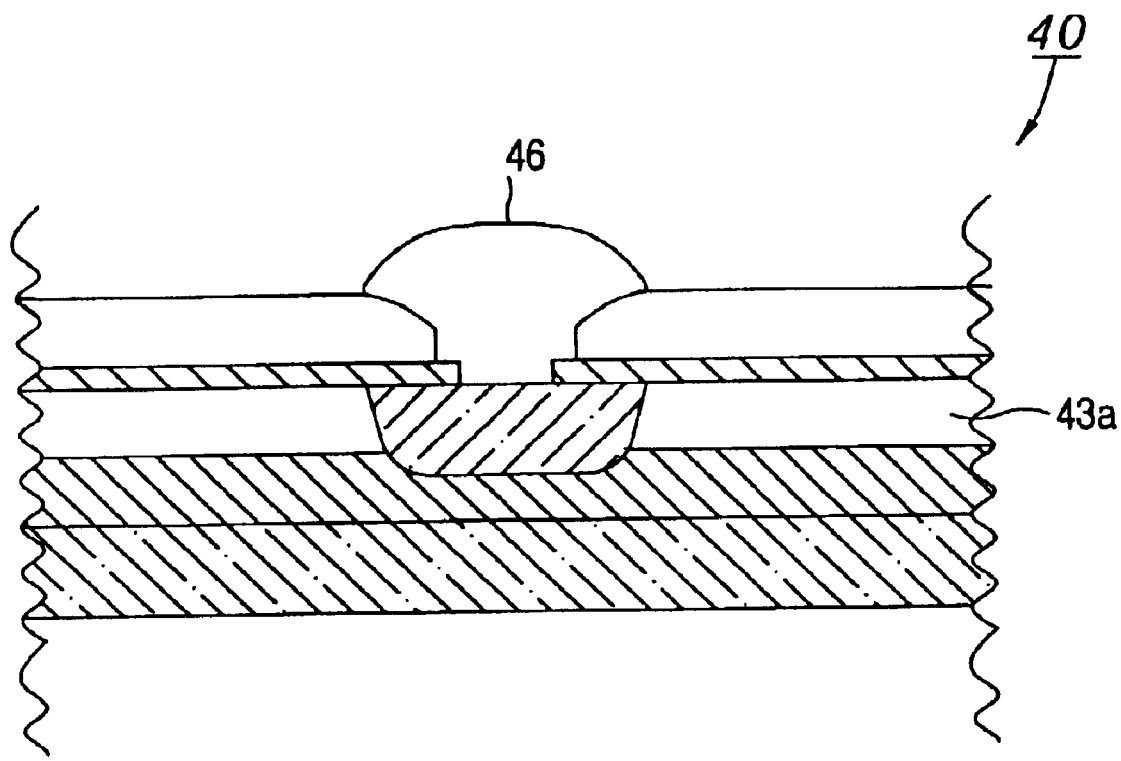

FIG. 4d shows that the metal 46 of electrical conductivity having a mushroom shape is formed. The metal 46 of electrical conductivity is formed in a mushroom shape as the shape of the hole 45b on the photoresist layer 45a becomes broader as it moves farther away from the insulation layer 44a. The metal 46 of electrical conductivity is formed by plating and serves as the p-type electrode, which is positioned higher than the photoresist layer 45a. As the spreading region 43b is made of semiconductor material, a predetermined metal layer (not shown) is deposited and formed on the window layer 43a for a subsequent plating to be performed.

Figure 4E:
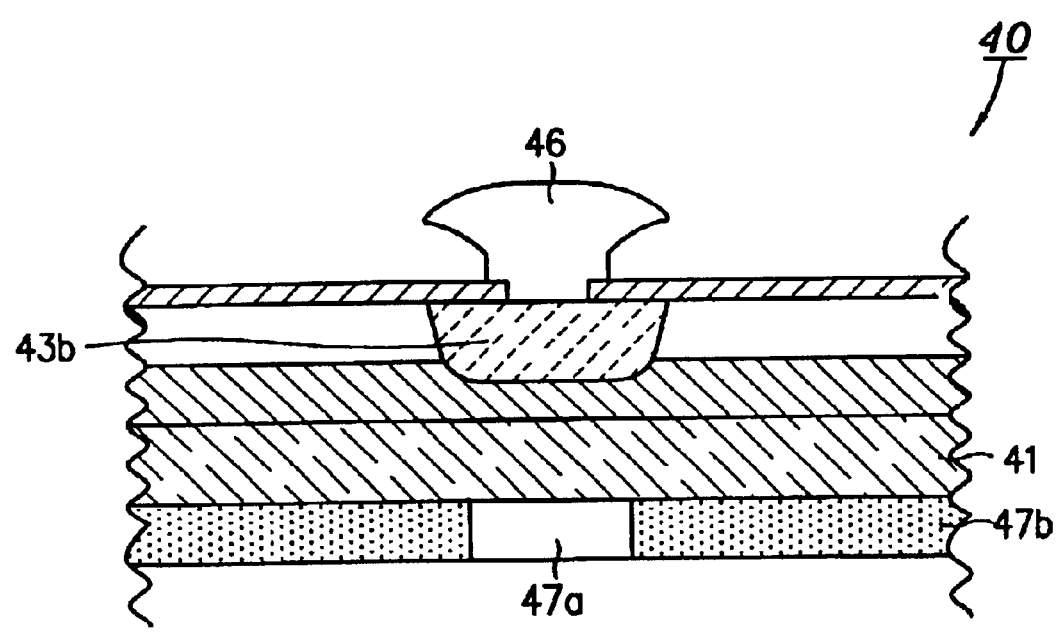

After the metal 46 of electrical conductivity is formed, the photoresist layer 45a is removed as shown in FIG. 4e, then non-reflection coating is applied on a rear side of the substrate 41, and the coating for the rest region, except for the region corresponding to the spreading region 43b, is removed by means of a photoetching process, thus forming a light receiving region 47a. An n-type electrode 47b is formed on the region where the non-reflection coating is removed using another metal of electrical conductivity, thereby completing the formation of a photodiode.

As described above, the present invention forms the p-type electrode of the photodiode in a mushroom shape, thereby minimizing capacitance of the photodiode, while accomplishing the electrode of a structure in which the wire bonding is easy to apply. That is, in the photodiode of a related art, there have been limitations in reducing the active area to secure the area for performing the wire bonding on the p-type electrode. The photodiode according to the present invention, however, forms the p-type electrode of a mushroom shape, thereby minimizing the area facing the p-InP spreading region as well as securing the area for the wire bonding.

In addition, the photodiode of the present invention lowers capacitance by reducing the area for the p-InP spreading region. Also, the etching process is not performed for the u-InGaAs absorption layer or the u-InP window layer stacked on the InP substrate, instead, a method of spreading a p-type dopant on the u-InP window layer is adopted, thus preventing the u-InGaAs absorption layer or the u-InP window layer from being exposed to the atmosphere and oxidized accordingly. Moreover, the contact area of the u-InGaAs absorption layer with the insulation layer is blocked by the u-InP window layer, so that the u-InGaAs absorption layer is not exposed to the current leakage, thereby improving the reliability of the optical elements. Furthermore, the p-type electrode is formed in a mushroom shape, whereby a sufficient bonding area is secured which in turn makes the wired bonding easy.

The foregoing embodiments and advantages are merely exemplary and are not to be construed as limiting the present invention. The description of the present invention is intended to be illustrative, not to limit the scope of the claims. Many alternatives, modifications, and variations will be apparent to those skilled in the art. In the claims, means-plus-function clauses are intended to cover the structures described herein as performing the recited function and not only structural equivalents but also an equivalent structure.

What is claimed is:

1. A photodiode for ultra high speed optical communication comprising: a substrate; an absorption layer formed on upper surface of the substrate; a window layer stacked on the absorption layer; an insulation layer having a predetermined hole stacked on the window layer; a spreading region having a predetermined dopant spread on a part of the window layer facing the predetermined hole; and, an electrode having a mushroom shape disposed above the insulation layer and connected to one end of the spreading region through the predetermine hole, wherein the electrode comprises an upper surface and a lower surface, the width of the upper surface of the electrode is substantially broader the lower surface of the electrode, so that a space between the insulation layer and an outer periphery of the electrode forms a contact area for a subsequent wire boding.

2. The photodiode according to claim 1, wherein other end of the spreading region is further extended up to a portion of the absorption layer.

3. The photodiode according to claim 1, wherein the space between the insulation layer and an outer periphery of the electrode is filled with air of low dielectric constant.

4. The photodiode according to claim 1, wherein a contact area between the upper electrode and the insulation layer is narrower than the surface area of the spreading region.

5. A photodiode for ultra high speed optical communication comprising: an InP substrate; an InGaAs absorption layer stacked on at one end of the InP substrate; an InP window layer stacked on the InGaAs absorption layer; an insulation layer having a predetermined hole stacked on the InP window layer, a p-InP spreading region in which a p-type dopant is doped on a part of the InP window layer facing the hole; and, a metal conducting element having a mushroom shape above the insulation layer electrically connected to the p-InP spreading region through the predetermined hole, wherein the electrode comprises an upper surface and a lower surface, the width of the upper surface of the electrode is substantially broader than the lower surface of the electrode, so that a space between the insulation layer and an outer periphery of the metal conducting element forms a contact area for a subsequent wire boding.

6. The photodiode according to claim 5, wherein the other end of the p-InP spreading region is further extended up to a part of the InGaAs absorption layer.

7. The photodiode according to claim 5, wherein the space between the insulation layer and an outer periphery of the electrode is filled with air of low dielectric constant.

8. The photodiode according to claim 5, wherein contact area mutually faced by the metal conducting element and the insulation layer is narrower than the surface area of the spreading region.

* * * * *